US007874880B2

(12) United States Patent
Fedde et al.

(10) Patent No.: US 7,874,880 B2
(45) Date of Patent: Jan. 25, 2011

(54) ADAPTER APPARATUS WITH SLEEVE SPRING CONTACTS

(75) Inventors: Mickiel P. Fedde, Eagan, MN (US); Ranjit Raghunath Patil, Eden Prairie, MN (US)

(73) Assignee: Ironwood Electronics, Inc., Burnsville, MN (US)

( * ) Notice: Subject to any disclaimer, the term of this patent is extended or adjusted under 35 U.S.C. 154(b) by 0 days.

(21) Appl. No.: 12/393,303

(22) Filed: Feb. 26, 2009

(65) Prior Publication Data

US 2010/0216321 A1   Aug. 26, 2010

(51) Int. Cl.
*H01R 13/33* (2006.01)
(52) U.S. Cl. .......................................... 439/841; 439/66
(58) Field of Classification Search ................ 439/841, 439/66, 840
See application file for complete search history.

(56) References Cited

U.S. PATENT DOCUMENTS

| | | | | |
|---|---|---|---|---|
| 3,157,455 | A | * | 11/1964 | Takano ........................ 439/841 |
| 3,503,033 | A | * | 3/1970 | Kennedy, Jr. .................. 439/75 |
| 3,971,610 | A | | 7/1976 | Buchoff et al. |
| 4,082,399 | A | * | 4/1978 | Barkhuff ...................... 439/264 |
| 4,341,433 | A | | 7/1982 | Cherian et al. |
| 4,421,368 | A | | 12/1983 | Saban |
| 4,508,405 | A | * | 4/1985 | Damon et al. ................ 439/260 |
| 5,076,794 | A | | 12/1991 | Ganthier |
| 5,418,471 | A | | 5/1995 | Kardos |
| 5,479,319 | A | | 12/1995 | Werther |
| 5,645,433 | A | | 7/1997 | Johnson |
| 5,691,041 | A | | 11/1997 | Frankeny et al. |
| 5,702,255 | A | | 12/1997 | Murphy et al. |
| 5,712,768 | A | | 1/1998 | Werther |
| 5,742,481 | A | | 4/1998 | Murphy et al. |
| 5,770,891 | A | | 6/1998 | Frankeny et al. |
| 5,810,607 | A | | 9/1998 | Shih et al. |
| 5,876,219 | A | | 3/1999 | Taylor et al. |
| 5,892,245 | A | | 4/1999 | Hilton |
| 5,982,635 | A | | 11/1999 | Menzies et al. |
| 5,990,697 | A | * | 11/1999 | Kazama ....................... 324/761 |
| 6,007,348 | A | | 12/1999 | Murphy |
| 6,086,432 | A | * | 7/2000 | Frinker et al. ................ 439/841 |
| 6,323,667 | B1 | | 11/2001 | Kazama |
| 6,325,280 | B1 | | 12/2001 | Murphy |
| 6,352,437 | B1 | | 3/2002 | Tate |
| 6,388,885 | B1 | * | 5/2002 | Alexander et al. ........... 361/760 |
| 6,462,573 | B1 | | 10/2002 | McAllister et al. |
| 6,638,097 | B2 | * | 10/2003 | Wu et al. ...................... 439/482 |
| 6,769,919 | B2 | * | 8/2004 | Kosmala ....................... 439/66 |
| 6,844,749 | B2 | | 1/2005 | Sinclair |
| 6,937,045 | B2 | | 8/2005 | Sinclair |
| 7,057,403 | B2 | | 6/2006 | Kazama |
| 7,368,814 | B1 | | 5/2008 | Tully et al. |
| 7,463,041 | B2 | | 12/2008 | Kazama |

(Continued)

OTHER PUBLICATIONS

U.S. Appl. No. 11/069,102, filed Mar. 1, 2005, Fedde et al.

(Continued)

*Primary Examiner*—Gary F. Paumen
(74) *Attorney, Agent, or Firm*—Mueting, Raasch and Gebhardt, P.A.

(57) ABSTRACT

An adapter apparatus includes a substrate having a plurality of openings defined therethrough. Further, a sleeve spring contact is mounted in each of the openings.

12 Claims, 7 Drawing Sheets

U.S. PATENT DOCUMENTS

| | | |
|---|---|---|
| 7,470,149 B2 | 12/2008 | Kazama et al. |
| 7,476,132 B2 * | 1/2009 | Xu .............................. 739/700 |
| 2003/0032310 A1 | 2/2003 | Weiss et al. |
| 2004/0242030 A1 | 12/2004 | Palaniappa et al. |
| 2005/0196979 A1 | 9/2005 | Fedde et al. |
| 2008/0064270 A1 * | 3/2008 | Ohshima et al. ............ 439/841 |
| 2009/0009205 A1 | 1/2009 | Kazama |
| 2009/0011662 A1 * | 1/2009 | Yumi et al. .................. 439/840 |
| 2009/0093161 A1 | 4/2009 | Kazama et al. |

OTHER PUBLICATIONS

"Innovative Contact Techniques," *Burn-In Test Socket Workshop*, Session 5, Archive 2008, Mar. 9-12, 2008, 29 pgs.

* cited by examiner

ADAPTER APPARATUS WITH SLEEVE SPRING CONTACTS

BACKGROUND

The present invention relates generally to adapters for use with packaged devices or other adapter apparatus (e.g., male pin adapters).

Certain types of integrated circuit packages are becoming increasingly popular due to their occupancy area efficiency. In other words, they occupy less area on a target board on which they are mounted while providing a high density of contact terminals. For example, such high density package types may include a ball grid array or land grid array package.

Generally, for example, ball grid array packages contain an integrated circuit having its die bond pads electrically connected to respective conductive solder spheres that are distributed on the bottom surface of the package in an array. A target printed circuit board typically has formed on its surface a corresponding array of conductive pads which align with the array of solder spheres for electrically mounting the ball grid array package on the target board.

The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging (e.g., ball grid array packages) provide a high density of terminals at a very low cost. Also, this packaging provides for limited lead lengths. Limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a ball grid array package mounted thereon, the designer must first electrically connect the solder spheres on the ball grid array package to the target circuit board. As described above, this generally includes mounting the ball grid array package on the target board and heating the solder spheres to fuse the solder spheres to the conductive pads of the target board.

Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with packages soldered thereon.

Various adapters which are used for electrically connecting high density packaged devices to a target printed circuit board are known. Various intercoupling components are used to provide such adapters. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal" describe several adapter apparatus for use in mounting ball grid array packages, as well as intercoupling components of other conventional adapter devices, in many instances such adapters have terminals (e.g., female socket pins) configured for receiving a mating terminal (e.g., female socket pins configured to receive male pins). For example, such female socket pins may be press-fit into openings formed in an insulative material so as to provide a contact for receiving a male pin.

Conventional female pin contacts are generally constructed with use of a stamped clip which is formed in a circle with separate fingers which are pushed aside when a male pin is inserted. For example, such a clip is generally manufactured using a stamping or rolling process (e.g., with a material such as berylium copper alloy).

However, such clip manufacturing can be prohibitively costly due to the necessary tooling required when the sockets in which the female socket pins are used have a very small pitch (e.g., in the 0.5 millimeter range). Further, the tooling to form such female clips can be difficult to miniaturize because of the inherent inaccuracies of stamping very small parts.

SUMMARY

The disclosure herein relates generally to adapter apparatus that use sleeve springs to provide a female socket pin into which a male pin may be inserted. For example, such a sleeve spring may overcome the manufacturing problems of stamped clip type female contacts.

One exemplary adapter apparatus disclosed herein includes a substrate (e.g., a substrate with a plurality of openings defined therethrough) and a plurality of conductive sleeve spring contacts. Each of the plurality of sleeve spring contacts is mounted within a corresponding opening of the plurality of openings (e.g., in a compressed state). Each of the plurality of sleeve spring contacts includes a plurality of windings about an axis of the sleeve spring contact forming at least a first winding section and a second winding section (e.g., the second winding section of the sleeve spring contact may include one or more windings in contact with adjacent windings, and further one or more windings of the second winding section may include windings having a smaller diameter than other windings of the second winding section for making contact with a male pin when the male pin is inserted along the axis of the sleeve spring contact).

In one or more embodiments of the adapter apparatus, the first winding section of the sleeve spring contact may include one or more windings that are not in contact with adjacent windings to allow compression of the sleeve spring contact when being mounted in a corresponding opening of the plurality of openings.

In one or more embodiments, the sleeve spring contact may further include a conductive pin element to mount the plurality of windings within the opening in a compressed state. For example, the conductive pin element may include a first end portion having an engagement surface for contact with an end of the plurality of windings and a second end portion opposite the first end portion configured for attachment to corresponding pads of a target board.

Further, in one or more embodiments, the substrate may includes a first surface region and a second surface region opposite the first surface region. Each of the openings may be defined through the substrate from the first surface region to the second surface region. An engagement surface may define at least a portion of the opening proximate the first surface region to engage a first end of the plurality of windings mounted within the opening, and further, each of the conductive sleeve spring contacts may include a conductive pin element mounted at least partially within the opening proximate the second surface region (e.g., by press-fit or using a curable material). For example, the conductive pin element may include an engagement surface to engage a second end of the plurality of windings mounted within the opening.

Another embodiment of an adapter apparatus may include a plurality of conductive sleeve spring contacts. For example, each sleeve spring contact may include a conductive sleeve spring extending between a first spring end and a second spring end along a spring axis. Each sleeve spring may include a first winding section that includes a plurality of windings about the spring axis terminating in the first spring end and a second winding section that includes a plurality of windings terminating in the second spring end. For example, the plurality of windings of the second winding section of the sleeve spring may include windings in contact with adjacent windings and at least one or more windings that have a smaller diameter than other windings of the second winding section for making contact with a male pin when the male pin is inserted along the axis of the sleeve spring. Further, the first winding section of the sleeve spring may include a plurality of windings that are not in contact with adjacent windings.

In one or more embodiments of the adapter apparatus, each of the plurality of conductive sleeve spring contacts are mounted in a corresponding opening of a plurality of openings defined in a substrate (e.g., each of the conductive sleeve springs may be mounted within the opening in a compressed state by a conductive pin element)

Yet further, one exemplary embodiment of a method for use in forming an adapter apparatus may include providing a substrate including a plurality of openings defined therethrough. The substrate may include a first surface region and a second surface region opposite the first surface region (e.g., each of the openings may be defined through the substrate from the first surface region to the second surface region). Further, the method may include inserting a conductive sleeve spring into each of the plurality of openings at the second surface region (e.g., each conductive sleeve spring may extend between a first spring end and a second spring end along a spring axis, each sleeve spring may include a first winding section that includes a plurality of windings about the spring axis terminating in the first spring end and a second winding section that includes a plurality of windings terminating in the second spring end, the plurality of windings of the second winding section of the sleeve spring may include windings in contact with adjacent windings and at least one or more windings that have a smaller diameter than other windings of the second winding section for making contact with a male pin when the male pin is inserted along the axis of the sleeve spring, and further, the first winding section of the sleeve spring may include a plurality of windings that are not in contact with adjacent windings). Each of the conductive sleeve springs is mounted such that the sleeve spring is at least partially compressed within the opening (e.g., using a conductive pin element inserted at least partially in opening).

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

Figure 1:
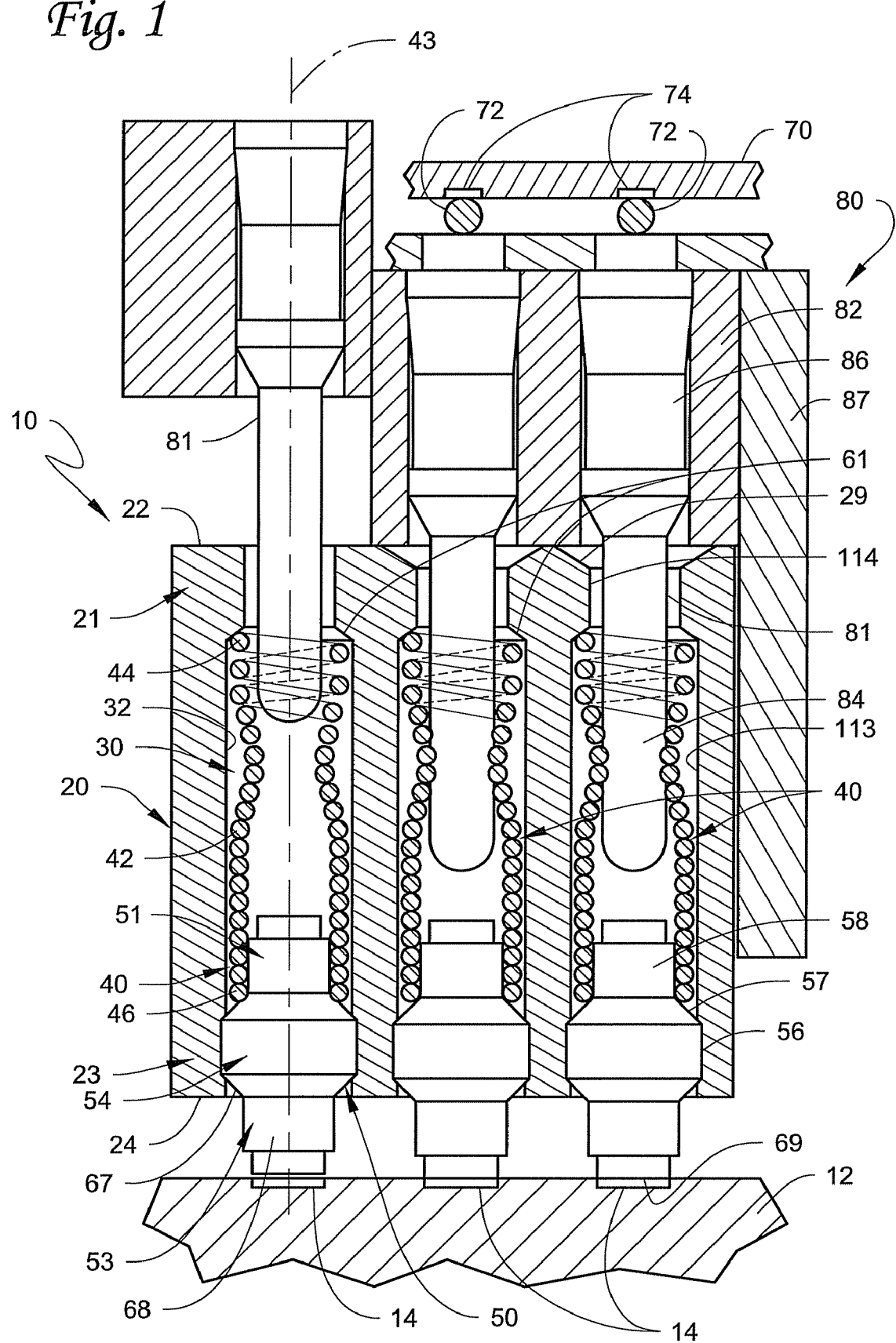
FIG. 1 is a generalized illustrative diagram of one exemplary embodiment of a portion of an adapter apparatus including a sleeve spring contact for use in mounting a packaged device relative to a target board.

The figures are rendered primarily for clarity and, as a result, are not necessarily drawn to scale.

DETAILED DESCRIPTION OF EXEMPLARY EMBODIMENTS

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary adapter apparatus shall generally be described with reference to FIGS. 1-6. It will be apparent to one skilled in the art that elements from one embodiment may be used in combination with elements of the other embodiments, and that the possible adapter apparatus embodiments using features set forth herein is not limited to the specific embodiments described. Further, it will be recognized that the embodiments described herein will include many elements that are not necessarily shown to scale. Further, it will be recognized that the size and shape of various elements herein may be modified without departing from the scope of the present disclosure, although one or more shapes and sizes may be advantageous over others.

FIG. 1 shows a generalized diagrammatic view of an exemplary adapter apparatus 10. The adapter apparatus 10 includes a substrate 20. Substrate 20 comprises a body of material extending between a first surface 22 and a second surface 24. In one embodiment of substrate 20, the first surface 22 and the second surface 24 are planer surfaces that generally lie parallel to one another.

The substrate 20 may be formed of any suitable insulative material (e.g., polyimide materials). Preferably, substrate 20 is formed of a high temperature material (e.g., a material that is suitable for use in temperatures that exceed 125° C.). For example, the substrate 20 may be formed of one or more materials such as polyetheretherketone (PEEK), Ceramic filled PEEK or other grades of PEEK, Torlon, FR4, G10, Kapton, or Rogers R04350.

In one embodiment, the substrate 20 may be of a size generally equivalent to a packaged device (e.g., packaged device 70) which is to be mounted using the adapter apparatus 10. However, one skilled in the art will recognize that the size and shape of the substrate material 20 may vary based on the application of the adapter apparatus (e.g., the adapter apparatus may be configured to mount more than one packaged device).

The present invention may be used to mount various types of packaged devices, including, but not limited to, for example, surface mount devices, such as ball grid array packages, land grid array packages, quad flat no leads (QFN) devices, column grid array packages, non-solder ball packages, other packaged devices with surface mount pads, etc. One will recognize that the configuration of the adapter apparatus may be different depending on the type of the packaged device being mounted (e.g., the apparatus being different or the same for a package including solder balls versus a non-solder ball package).

As shown in FIG. 1 and FIGS. 3A-3C, in one or more embodiment, the substrate 20 includes a plurality of openings 30 defined through the substrate 20 by one or more surfaces 32. The openings 30, as shown in FIG. 1, are defined through substrate 20 from first surface 22 in first surface region 21 to second surface 24 of substrate 20 in second surface region 23; second surface region 23 being opposite first surface region 21. The size and shape of the openings 30 will be dependent upon the structure used to mount conductive sleeve spring contacts in corresponding openings 30.

Figure 3A:
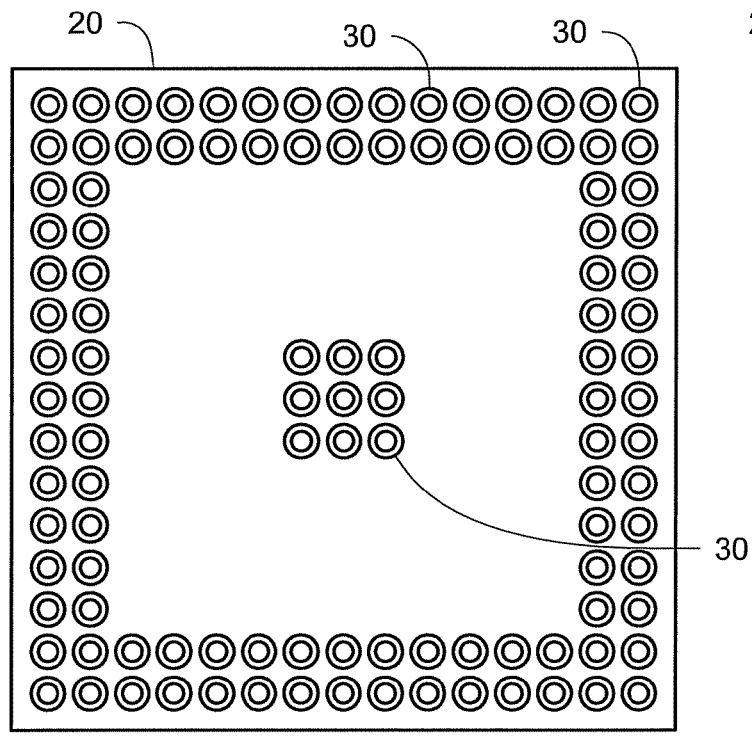
FIGS. 3A-3C show a plan view, a side view, and a more detailed cross-section view of a portion, respectively, of an exemplary embodiment of a substrate usable to provide an adapter apparatus such as the adapter apparatus of FIG. 2A.
Figure 3B:
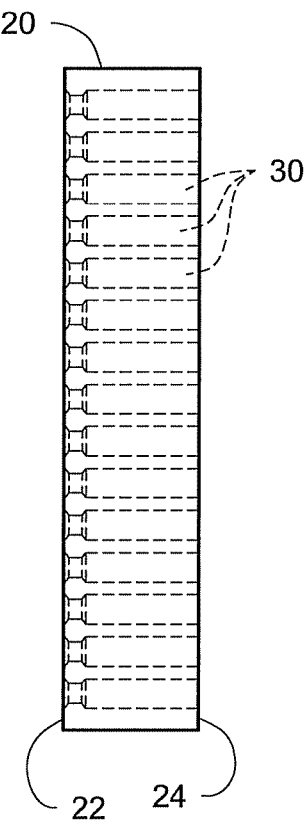
Figure 3C:
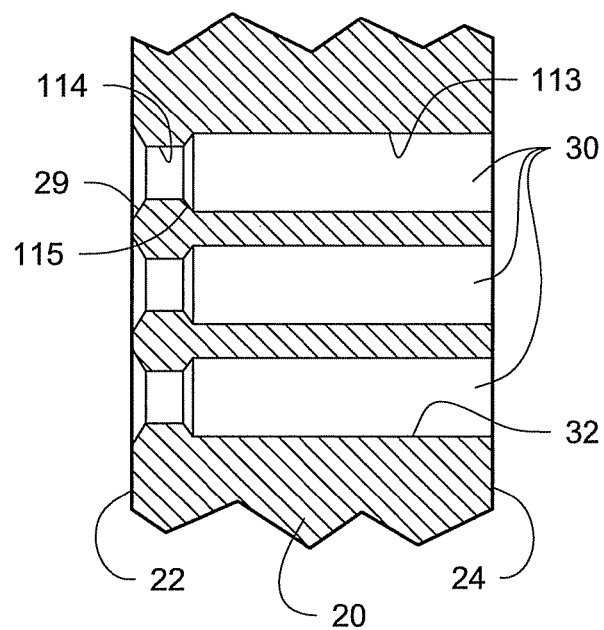

In one or more embodiments, as shown in the plan view, the side view, and the partial detailed cross-section view of FIGS. 3A-3C, the substrate 20 may include a plurality of openings 30 proximate the perimeter of the substrate 20 and one or more openings 30 towards the middle of the substrate 20. However, any number or configurations of openings 30 may be used. Further, each opening 30 may be defined using different diameter surfaces defining different portions of the opening 30. For example, as further described herein, for mounting the sleeve spring 40 in the opening 30, the opening 30 may be defined by surfaces 113 and 114 (e.g., each having a different diameter) with a transition surface (e.g., surface 115) therebetween. For example, the transition surface may be used as an engagement surface for mounting sleeve spring 40 within opening 30 (e.g., the surface may be at an angle of 60 degrees relative to axis 43 or any other angle suitable to engage the spring in a manner such that it can be compressed as described herein). Various configurations of such openings with different defining surfaces may be used to accommodate mounting of the sleeve spring 40. Such surfaces 32 may be defined by drilling one more holes through the substrate 20.

Conductive sleeve spring contacts 40 are mounted in each opening 30 defined through the substrate 20. The sleeve spring contacts 40 may be mounted in the openings 30 in any suitable manner (e.g., using any suitable structure, such as particular configurations of the walls defining the openings 30 or any type of conductive pin element structures) so as to allow a male pin (e.g., such as elongated male pin 81) to be inserted into the center of a sleeve spring used to provide the sleeve spring contact 40 as described herein. Further, suitable structure for mounting such conductive sleeve spring contacts 40 within the openings may provide a conductive portion for use in electrical connection of the male pin 81, through the sleeve spring contact 40, to another conductive element, such as a matching pad 14 on a target board 12 (e.g., a printed circuit board).

In at least one embodiment, each conductive sleeve spring contact 40 generally includes a sleeve spring 42 extending along a spring axis 43 from a first spring end 44 to a second spring end 46. Such a sleeve spring 42 is shown in an uncompressed state (e.g., a free length state) in FIG. 4A and a compressed state in FIG. 4B having a downward force (i.e., a force applied along spring axis 43) applied thereto. For example, in one embodiment, the downward force 301 is 1.5 times the force 302 at the waist 45 of the sleeve spring 42 (e.g., the waist being the portion of windings that contact the male pin when inserted into the center of the spring along the axis 43).

In one or more embodiments, each sleeve spring 42 includes a plurality of windings 39 about spring axis 43 forming at least a first winding section 48 and a second winding section 49. The second winding section 49 of the sleeve spring contact 42 includes one or more windings in contact with adjacent windings (e.g., terminating in the second spring end 46), and further one or more windings of the second winding section 49 include windings having a smaller diameter than other windings of the second winding section 49 (e.g., providing the waist 45 of the sleeve spring 42) for making contact with a male pin when the male pin is inserted along the axis of the sleeve spring contact 42 (e.g., the axis being the same as the axis 43 of the sleeve spring 40).

In one or more embodiments, the first winding section 48 of the sleeve spring 42 includes one or more windings that are not in contact with adjacent windings (e.g., a standard type of spring arrangement) to allow compression of the sleeve spring 42 when mounted in a corresponding opening 30. In other words, the windings are loosely wound such that the windings may move closer together along the axis 43 when a force is applied (e.g., one or more windings of the section 48 may move into contact with adjacent windings, or may continue to be apart from adjacent windings). At least in one embodiment, the waist 45 of the sleeve spring 40 is directly adjacent the loose windings (e.g., the smaller diameter windings are between the first winding section 48 and the windings of the second winding section 49 that have a larger diameter than those at the waist or mid-section 45).

At least in one or more embodiments, the plurality of windings 46 are mounted within the opening 30 in at least a partially compressed state at a compressed length 305. At least in one embodiment, since the windings of the second winding section 49 are in contact with adjacent windings, the length 304 of the second winding section does not substantially change between the uncompressed state (i.e., free length state) and compressed state of the sleeve spring 42. For example, the sleeve spring 42 may be compressed to a length that is 95 percent or less than the spring's free length, may be compressed to a length that is 90 percent or less than the spring's free length, may be compressed to a length that is 80 percent or less than the spring's free length, or may be compressed to a length that is 70 percent or less than the spring's free length.

In other words, at least in one embodiment, each sleeve spring 42 extends between the first spring end 44 and the second spring end 46 along spring axis 43. Each sleeve spring 42 includes the first winding section 48 that includes a plurality of windings about the spring axis 43 terminating in the first spring end 44 and the second winding section 49 that includes a plurality of windings terminating in the second spring end 46. The plurality of windings of the second winding section 49 of the sleeve spring 42 include windings in contact with adjacent windings; wherein at least one or more windings of the second winding section 49 have a smaller diameter than other windings of the second winding section 49 for making contact with a male pin when the male pin is inserted along the axis 43 of the sleeve spring 42. Further, for example, the first winding section 48 of the sleeve spring 42 may include a plurality of windings that are not in contact with adjacent windings. At least in one embodiment, all of the windings of the second winding section 49 (e.g., the second winding section starting at least where contact is made between the male pin and the windings, and terminating at the second end of the spring) are in contact with adjacent windings. For example, in one embodiment, the second winding section 49 may be said to start at the winding having the smallest diameter. In one or more other embodiments, the second winding section 49 may be said to start at a winding above the smallest diameter winding towards the first end of the spring).

The sleeve springs 42, in one or more embodiments, are configured for mounting in openings of a substrate where the pitch of the contacts of the adapter apparatus is in the range of about 0.3 mm to about 0.75 mm. The waist 45 is configured with an inner diameter 306 so as to provide effective contact with a male pin 81 when the male pin 81 is inserted through the center of the sleeve spring 42 and within the windings having a smaller diameter than the other windings of the second winding section 49.

As shown in FIG. 1, in one or more embodiments, each of the conductive sleeve springs 42 is mounted within the opening 30 in a compressed state using a conductive pin element 50. For example, the conductive pin element 50 as shown in FIG. 1, and in further detail in the side and plan view of FIGS. 5A-5B, includes a first end portion 51 for contact with the second spring end 46 terminating the second winding section 49 and a second end portion 53 opposite the first end portion 51, e.g., the second end portion as shown in FIG. 1 is configured for attachment to a corresponding pad 14 of a target board 12.

Further, in one or more embodiments, the conductive pin element 50 is configured to be mounted in a portion of the opening 30 defined at the second surface region 23 of the substrate 20. For example, as shown in FIG. 1, the conductive pin element 50 includes a mid-section 54 provided between the first end portion 51 and second end portion 53. The mid-section 54 has a diameter greater than the diameter of the opening 30 (i.e., orthogonal to the axis 43) effective to provide an interference fit between the outer surface 56 of the mid-section 54 and surface 32 defining the opening 30 when the conductive pin element 50 is press-fit within the opening 30. The interference fit is sufficient to maintain the sleeve spring 42 in its at least partially compressed state when loaded into the opening 30. One will recognize that one or more structures or processes may be used to maintain the sleeve spring 42 in its compressed state within opening 30 (e.g., press-fit of pin element into opening 30, mounting of a pin element with a curable material as described herein with reference to FIG. 6, an additional substrate holding the conductive pin element 50, etc.).

Still further, in one or more embodiments, the first end portion 51 of the conductive pin element 50 includes an engagement surface such as shoulder surface 57 to engage (e.g., contact) the second spring end 46 of the sleeve spring 42 when mounted within the opening 30. Further, as shown in the exemplary embodiment of FIG. 1, the first end portion 51 includes an elongate portion 58 that extends within the center of the sleeve spring 42 to assist in holding the sleeve spring 42 in place (e.g., centered in opening 30).

The engagement surface, such as shoulder surface 57, acts in cooperation with a shoulder surface (e.g., an engagement surface) 61 that defines at least a portion of the opening 30 proximate the first surface region 21 to engage the first spring end 44 of the sleeve spring 42 when mounted within the opening 30. In other words, the surface 32 defining the opening 30 includes a surface having at least two different diameters (e.g., surfaces 113 and 114) with a transition (e.g., surface 115) therebetween (e.g., the shoulder) to provide an engagement surface for contact with the first spring end 44 of the sleeve spring 42 while allowing a male pin 81 to be inserted into the opening 30 and along axis 43 of the sleeve spring 43.

One will recognize that the engagement surfaces to engage the first end 44 and second end 46 of the sleeve spring 42 may be provided in any suitable manner. For example, the engagement surface for engaging the first spring end 44 may be provided by surfaces defining the opening 30, may be provided by a separate element positioned in a portion of the opening defined at the first surface region 21 of the substrate 20, may be provided by a channel defined to receive the spring end, or may be provided in any other manner sufficient to allow the sleeve spring 42 to be compressed within the opening 30. Likewise, for example, the engagement surface for engaging the second spring end 46 may be provided by any suitable surfaces (e.g., surfaces of the pin element 50 or other cooperative structural part, such as an end of a tube or cylindrical element used to mount the spring) that allows the sleeve spring 42 to be compressed within the opening 30 (e.g., the sleeve spring 42 being compressed within the opening 30 between an engagement surface such as shoulder surface 61 proximate the first surface region 21 and an engagement surface such as the shoulder surface 57 of the pin element 50).

Such conductive pin elements and sleeve springs may be formed of any suitable conductive material for providing desired electrical conduction. For example, such conductive elements (e.g., plated or solid) may be formed of brass alloy, gold, nickel, or beryllium/copper alloy. Further, for example, such pin elements may be brass with a gold over nickel plating. Yet further, for example, the sleeve springs may be formed of stainless steel with a gold over nickel plating.

Still further, in one or more embodiments, the second end portion 53 of the conductive pin element 50 includes another shoulder region 67 transitioning from the mid-section 54 to an elongate portion 68. The elongate portion 68 terminates at a contact surface 69 that may be attached to a matching contact 14 on target board 12. At least in one embodiment, the contact surface 69 of pin element 50 may be configured for receipt of solder material (e.g., a solder ball, solder sphere, bump, or column) thereon. Depending on the type of material used to form the conductive pin element and the application of the adapter apparatus, at least in one embodiment, solder material may not be needed on the contact surface 69 (e.g., a gold end that can be otherwise soldered to the target board without the need to prevent the end from oxidation).

The conductive sleeve spring contacts 40 shown in FIG. 1 may be referred to as female socket pins mounted in corresponding openings 30 defined through substrate 20 for receiving male pins 81. In other words, as the adapter apparatus 10 includes female socket type contacts 40, a male pin adapter 80 may be used in conjunction therewith to mount a device (e.g., a BGA device 70), to the target board 12. For example, in one embodiment, the male pin adapter 80 includes a substrate 82 with a plurality of male terminal pins 81 mounted therethrough. Each of the male terminal pins 81 includes a pin portion 84 configured to be received in the sleeve spring contact 40 of adapter apparatus 10 and a contact portion 86 for providing electrical contact with a solder ball 72 of the device 70 (e.g., either directly or indirectly through another board 86 shown generally in FIG. 1, which may be an interposer, another adapter apparatus, etc.).

Further, for example, as shown in FIG. 1 and not to be considered limiting to the disclosure presented herein, the adapter apparatus 10 may be employed to mount a packaged device 70 (e.g., a BGA package) to target board 12. Target board 12 includes a pattern of contact elements 14 corresponding to a plurality of solder balls 72 of the ball grid array device 70. The solder balls 72 are provided on a pattern of contact pads 74 of the ball grid array device 70.

Solder material, as used herein, may be any suitable type of solder material generally known in the art. Such suitability will generally depend on the application for which the adapter apparatus is being used. For example, the solder material may include solder balls as shown in FIG. 1, solder films, solder spheres, partial solder spheres, solder columns, or any other suitable size and shape of material. Further, for example, the solder material may include eutectic 63/37 SnPb solder balls or solder spheres, or may be formed of lead free solder alloys such as SAC305 (Sn,Ag3.0,Cu0.5).

In other words, use of a sleeve spring 40 as shown herein provides a female socket pin that overcomes one or more of the problems with conventional stamped contacts. Generally, the sleeve spring 40 includes the two main sections; the bottom contains the second winding section 49 where solidly wound windings of the spring have a midsection of smaller and then larger diameter windings forming a "waist" 45 at the center of the solid windings. Each winding in this area solidly contacts the adjacent winding. This is beneficial for supplying a very low inductance electrical path, and therefore, very high frequency response. The loose windings at the top of the sleeve spring 42 in the first winding section 48 provide a downward force when compressed (e.g., keeping all the windings of the second winding section in contact with one another).

Figure 4A:
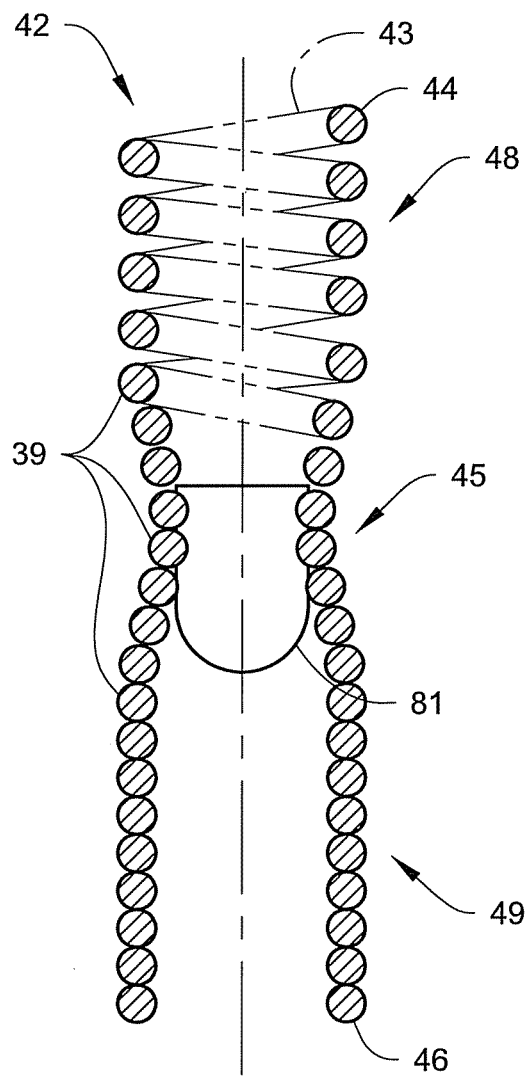
FIGS. 4A-4B show an illustrative side view of a sleeve spring in its uncompressed free state and an illustrative side view of a sleeve spring in its compressed state when held within a substrate for use in providing a female socket portion of an adapter apparatus such as the adapter apparatus of FIG. 2A.
Figure 4B:
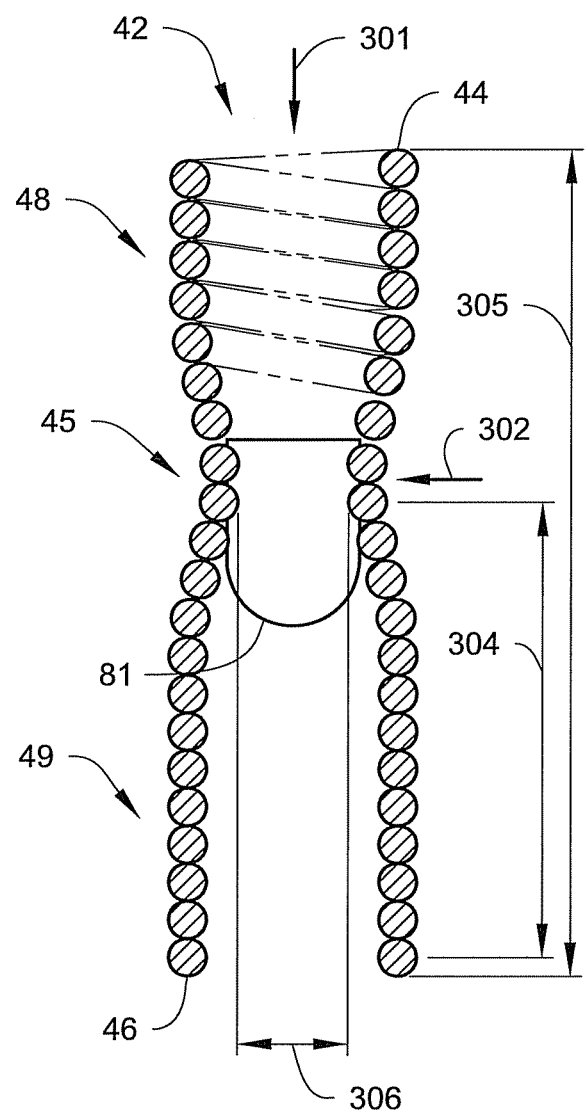
Figure 5B:
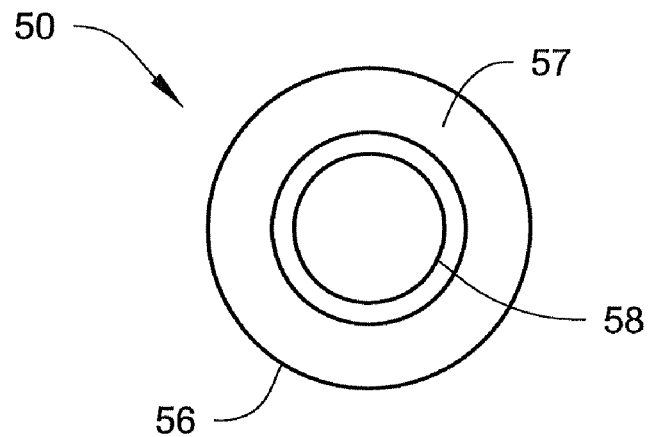
FIGS. 5A-5B show a side view and a plan view, respectively, of one exemplary embodiment of a pin element usable to provide an adapter apparatus such as the adapter apparatus of FIG. 2A.
Figure 5A:
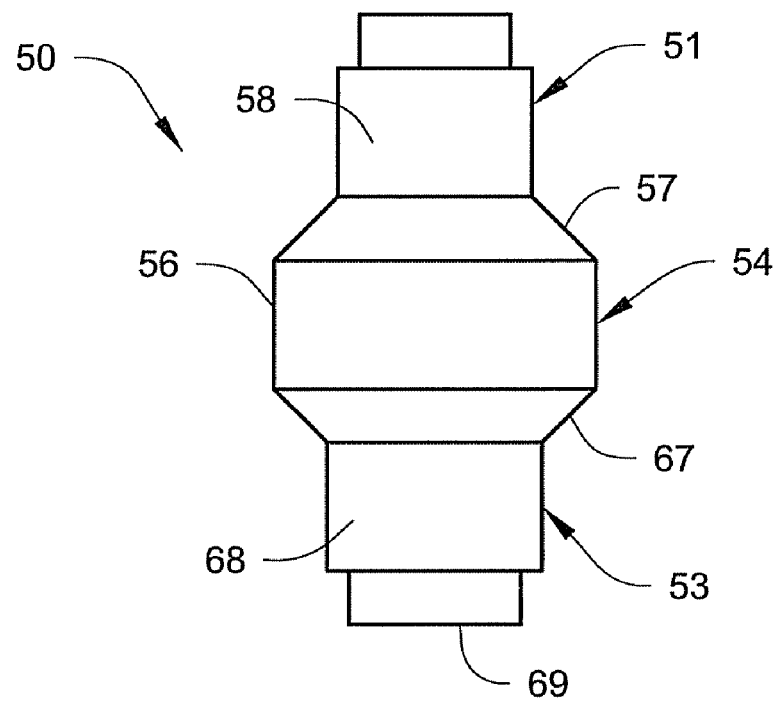

Further, as described herein, FIGS. 4A and 4B show the sleeve spring 42 in use as part of the sleeve spring contact 40. FIG. 4A shows a loose spring 40 before it is compressed in a cavity and FIG. 4B shows the spring 40 compressed in a cavity. A male pin 81 is inserted into the center of the spring 40 and causes the waist 45 of the sleeve spring 40 to expand and provide contact from the male pin 81 to anything contacting the sleeve spring 40 (e.g., the pin conductor or other structure).

As described herein, in one or more embodiments, the sleeve spring 40 is held in the opening 30 defined in the substrate 20 with the smaller diameter hole formed by surface 114 through the substrate 20 to the top surface 22. The sleeve spring 40 is held in the opening by the conductive pin element 50 that can be held in place in a portion of the opening 30 by press-fit or a curable solid material. In one or more embodiments, the sleeve spring 40 is inserted into the opening 30 and then the conductive pin element 50 is inserted thereafter into the opening from the same side to hold the spring 40 in the opening 30 in a compressed state. This assembly of substrate 20 with openings 30, springs 40, and solidly attached pin elements 50 at the bottom, can then be soldered to a series of matching pads 14 on a target PCB 12. The pin elements 50 can either be solid metal as shown, or optionally have solder balls attached to the bottom contact surface 69 of pin element 50 to emulate a BGA chip.

The male pin assembly or adapter 80 can then be inserted into the female adapter apparatus 10 that includes the sleeve springs 40 such that a chip or other electronic assembly can be connected to BGA pads or pattern on a target board 12. The male pins 81 of the male pin adapter 80 expands the sleeve springs 40. In addition, the loose wound spring area (e.g., the first winding section 48) provides a vertical force such that the solid spring area cannot become unsolid from forces from temperature transitions or vibration; thus keeping its high frequency characteristics under the various situations it may be expected to operate.

Figure 2A:
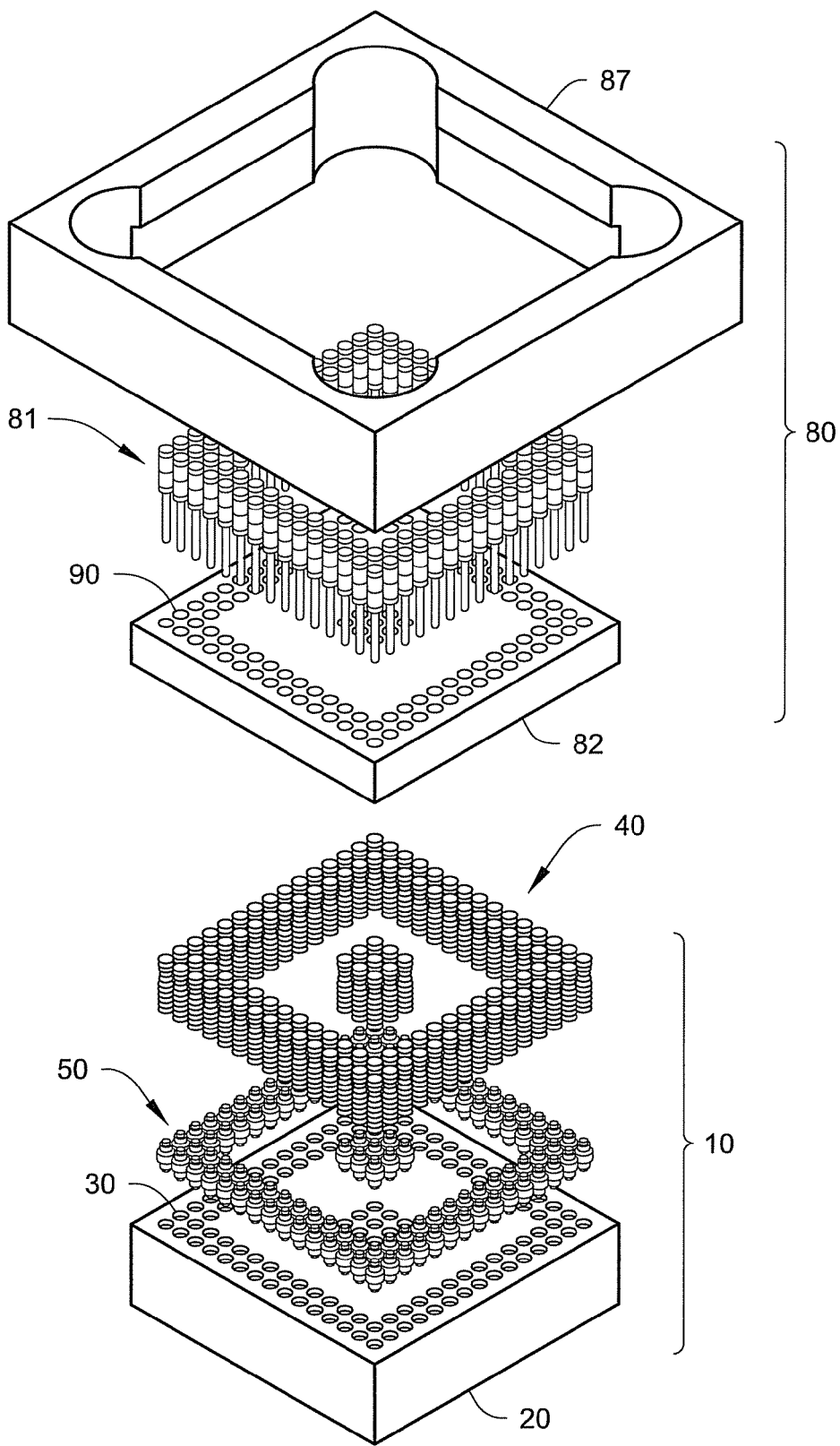
FIG. 2A is an exploded perspective view of one exemplary embodiment of an adapter apparatus such as illustratively shown in FIG. 1.
Figure 2B:
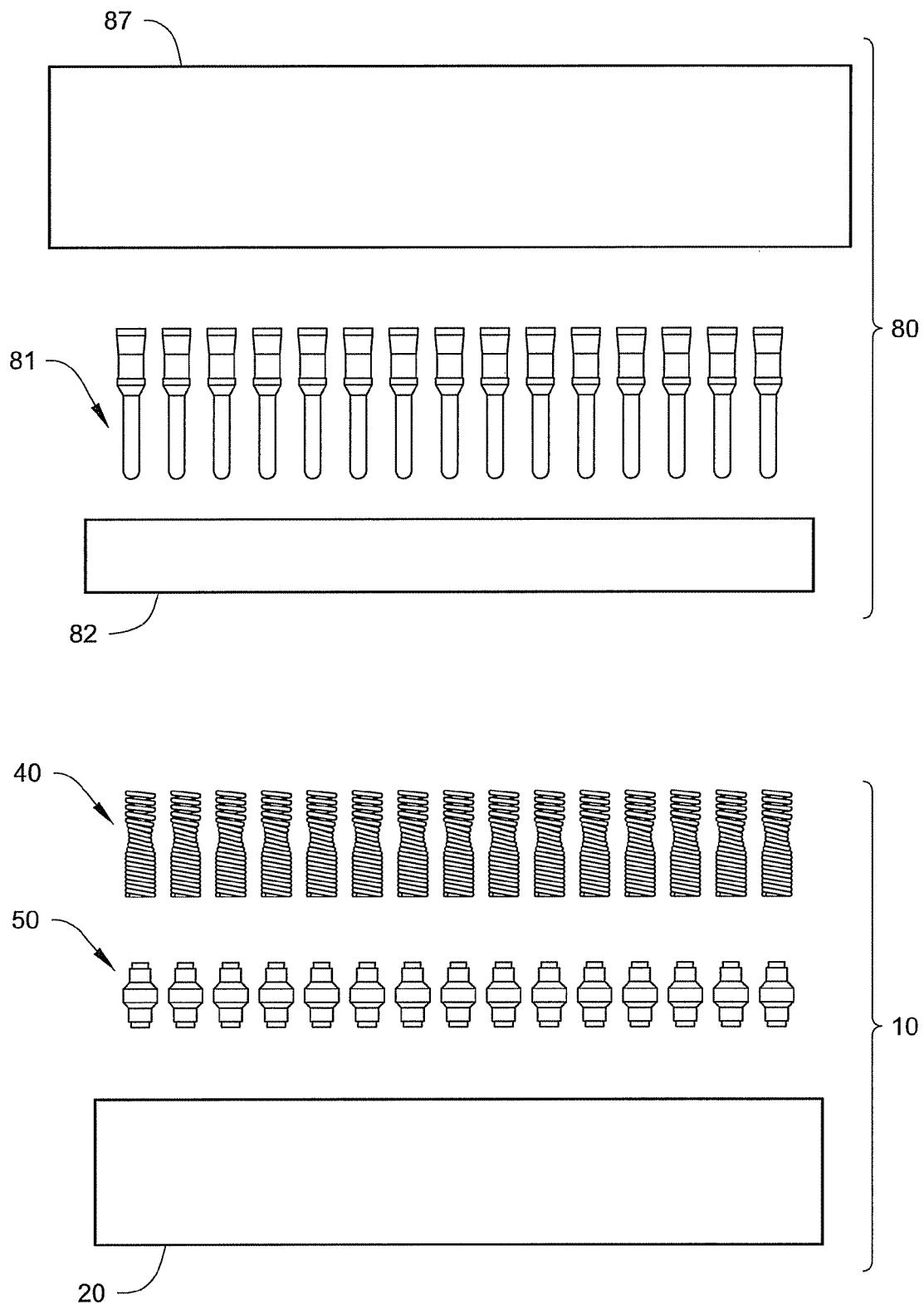
FIG. 2B is a side view of the exemplary embodiment of the adapter apparatus of FIG. 2A.

FIGS. 2A-2B show an exploded perspective view and an exploded side view, respectively, of one exemplary embodiment of components of the adapter apparatus 10 and male pin adapter 80, such as illustratively shown in FIG. 1. The adapter apparatus 10 includes the substrate 20, including the first surface 22 and a second surface 24 spaced apart therefrom. The adapter apparatus 20 further includes the conductive sleeve springs 40 to be mounted within openings 30 defined through substrate 20 from first surface 22 to second surface 24 using the conductive pin elements 50, such as, for example, described with reference to FIG. 1. The conductive pin element 40 may be press-fit within the openings 30 such as described with reference to FIG. 1, may be mounted within the openings 30 using a curable material as is described herein with reference to FIG. 6, or may be mounted in any other suitable manner.

The adapter apparatus 10 may be assembled as described herein with reference to the other Figures. For example, the adapter apparatus 10 is assembled to provide the contact surfaces 69 of conductive pin elements 50 at a first side of the adapter apparatus 10, for example, for connection to one or more pads 14 of a target board 12. Further, for example, the adapter apparatus 10 is assembled to provide a receiving region within the sleeve spring contact 40 for mating with a male terminal pin, such as a male terminal pin 81 of the male adapter apparatus 80.

The male adapter apparatus 80 as shown in FIGS. 2A-2B includes the substrate 82 having a plurality of openings 90 defined therethrough for receiving and holding the plurality of male terminal pins 81 configured for mating with the adapter apparatus 10 (e.g., press-fit in the openings 90). The male adapter apparatus 80 may be configured in any suitable manner for presenting the pins to mate with the sleeve springs contacts 40 of the adapter apparatus 10. For example, various components may be used to assist the mating of the male terminal pins 81 with the sleeve spring contacts 40. For example, as shown in FIGS. 1 and 2A-2B, a shroud 87 about the perimeter of the substrate 82 may be used for alignment of the male pin adapter 80 with adapter apparatus 10 (e.g., and thus, alignment of the male pins 81 with the axes 43 of the sleeve springs 40). Further, for example, a guiding surface (e.g., a beveled or countersunk guiding surface 29) at the first surface 22 about the opening 30 may be used to guide the male pins 81 into the openings 30.

As described herein, various mounting structures and mounting processes may be used to provide the conductive sleeve spring contacts 40 within the openings 30 defined through substrate 20. For example, a press-fitting of the conductive pin element 50 within the opening 30 to compress the sleeve spring 40 in the opening has been described herein. Further, a conductive pin element may also be mounted at least partially within the opening using a curable material to maintain the sleeve spring 40 in a compressed state as shown in FIG. 6.

Figure 6:
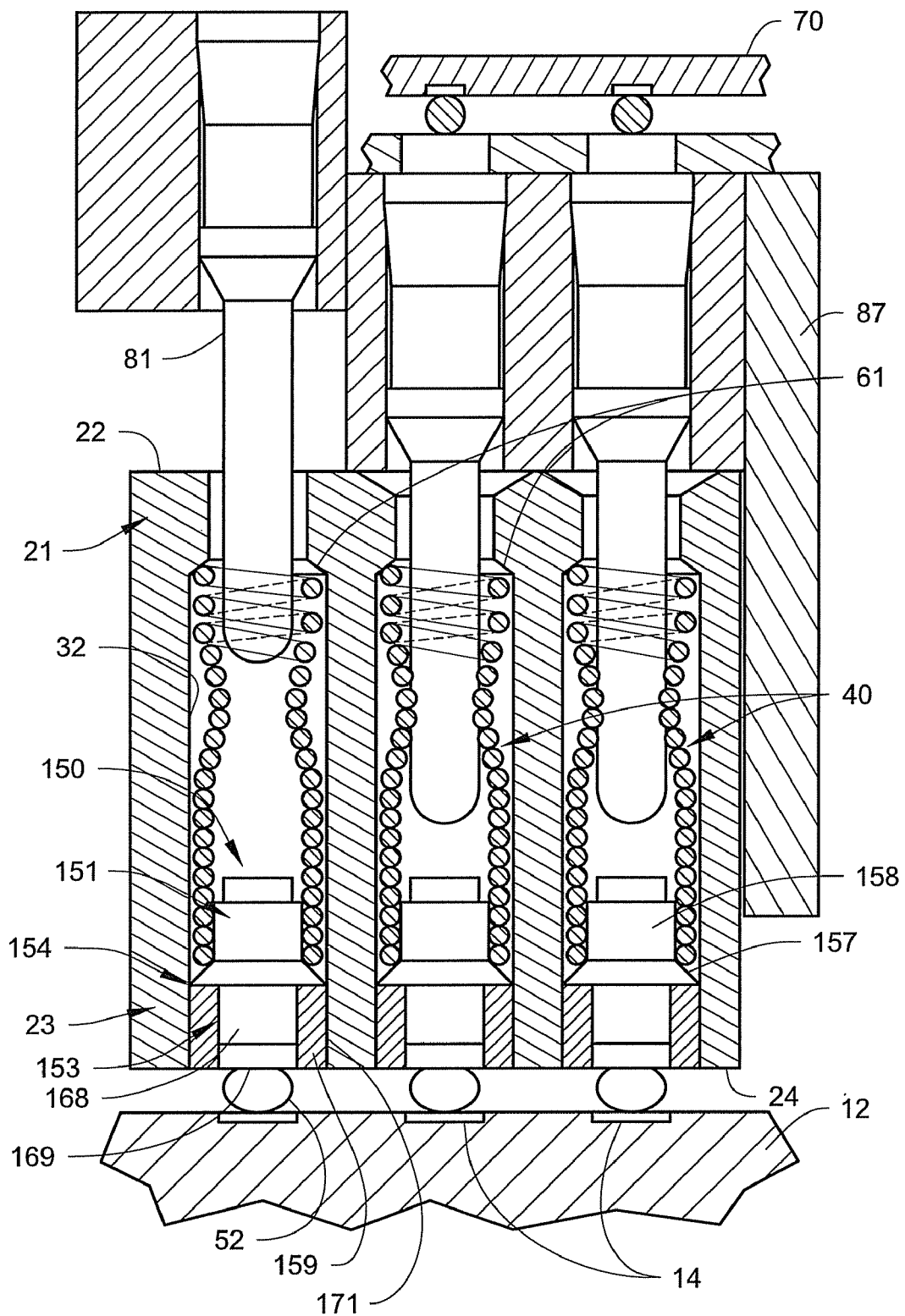
FIG. 6 is a generalized illustrative diagram of another exemplary embodiment of a portion of an adapter apparatus including a sleeve spring contact for use in mounting a packaged device relative to a target board.

FIG. 6 is substantially similar to FIG. 1, and therefore only components that differ from FIG. 1 will be denoted with different references numerals. For example, as shown in FIG. 6, a conductive pin element 150 is mounted in the opening 30 at the second surface region 23 using a curable material 152. One will recognize that the steps of such a mounting process may vary and the present disclosure is not limited to any particular described mounting process. The process for mounting the conductive pin element 150 in the opening 30 may include one or more of the steps or features as described in U.S. patent application Ser. No. 11/069,102 entitled "Adapter Apparatus with Conductive Elements Mounted Using Curable Material and Methods Regarding Same" filed 1 Mar. 2005, and incorporated herein by reference thereto.

For example, after drilling the openings 30 in the substrate, the plurality of sleeve springs 40 and the conductive pin elements 150 may be inserted into corresponding defined openings 30. Although any suitable insertion technique may be used, in one exemplary embodiment, vibrational loading of the conductive elements may be employed as known to those skilled in the art.

The conductive pin elements 150, for example, may each include a mid-section 154 provided between a first end portion 151 and a second end portion 153. The mid-section 154 may have a diameter substantially equal to or slightly less than the diameter of the opening 30 (i.e., orthogonal to the axis 43). Still further, in one or more embodiments, the first end portion 151 of the conductive pin element 150 may include an engagement surface such as shoulder surface 157 to engage the second end of the sleeve spring 42 when mounted within the opening 30. Further, as shown in the exemplary embodiment of FIG. 6, the first end portion 151 may include an elongate portion 158 that extends within the center of the sleeve spring 42 to assist in centering and hold the sleeve spring 42 in place. The engagement surface, such as shoulder 157, acts in cooperation with a shoulder surface (e.g., an engagement surface) 61 that defines at least a portion of the opening 30 proximate the first surface region 21 to engage the first end 44 of the sleeve spring 42 when mounted within the opening 30 such as described with reference to FIG. 1.

Still further, in one or more embodiments, the second end portion 153 of the conductive pin element 150 includes another elongate portion 168. The elongate portion 168 terminates at a contact surface 169 that may be attached to a matching contact 14 on target board 12. At least in one embodiment, the contact surface 169 of pin element 150 may be configured for receipt of solder material 52 (e.g., a solder ball, solder sphere, bump, or column) thereon. Further, in one or more embodiments, the contact surface 169 may be flush with the substrate surface 24 or it may extend past the surface 24 (e.g. protrude from the opening 30). Depending on the type of material used to form the conductive pin element and the application of the adapter apparatus, at least in one embodiment, solder material may not be needed on the contact surface 169.

At least a portion of the second end portion 153 has a diameter less than the opening 30 so as to provide a curable material receiving region 171 between the pin element 150 and the surface 32 defining the opening 30 when at least a portion of the pin element 150 is positioned within the opening 30. With the plurality of conductive pin elements 150 inserted into the corresponding defined openings or holes 30, each of the conductive pin elements 150 may be mounted in a corresponding opening 30 using a curable material 159.

For example, the curable material 159 may be provided into the curable material receiving regions 171 at the second surface 24 of the substrate 20. For example, the curable material may be provided with any suitable devices, such as dispensing devices, spinning devices, spreading devices (e.g., squeegee devices), etc. The present disclosure is not limited to any particular device. However, at least in one embodiment, a device for forcing some of the curable material 159 into the curable material receiving regions 171 is used. Thermal treatment may then be used to cure the curable material 159 received in the openings 30. However, depending on the type of curable material employed, other curing steps may be used and/or required (e.g., ultraviolet light application for a UV curable material). After curing, excess cured material may be removed at the surface 24 of the substrate 20 to expose the contact surfaces 169 of the conductive pin elements 150.

The curable material 159 may include any suitable curable adhesive material that provides insulative functionality. For example, such curable material may include UV-curable material or heat curable material (e.g., epoxy materials), or any other curable materials (e.g., acrylic materials). Further, for example, the curable material may be formed of an epoxy, such as DP-270, DP-100, or DP-420 epoxy available from 3M Corporation. Generally, the thermal characteristics of the cured material is preferably like those of the substrate material (e.g., similar thermal expansion coefficients).

At least in one embodiment, curable material 159 proximate (e.g., at the entry of the opening 30) the surface 24 of substrate 20 is formed so as to completely block entry of any material (e.g., solder) into the openings 30. For example, the entire curable material receiving region 171 radially about the conductive pin element 150 at the surface 24 of the substrate 20, and at least a predetermined distance into the opening 30 from surface 24, is entirely filled with curable material 159. When in a cured state, such material provides for blocking entry of material into the opening 30.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the invention, will be apparent to persons skilled in the art upon reference to this description.

The invention claimed is:

1. An adapter apparatus comprising:
a substrate, wherein a plurality of openings are defined through the substrate, wherein the substrate comprises a first surface region and a second surface region opposite the first surface region, wherein each of the openings is defined through the substrate from the first surface region to the second surface region, wherein an engagement surface defines at least a portion of the opening proximate the first surface region to engage a first end of the plurality of windings mounted within the opening; and
a plurality of conductive sleeve spring contacts, wherein each of the plurality of sleeve spring contacts is mounted within a corresponding opening of the plurality of openings, wherein each of the plurality of sleeve spring contacts comprises a plurality of windings about an axis of the sleeve spring contact forming at least a first winding section and a second winding section, wherein the second winding section of the sleeve spring contact comprises at least three or more windings in contact with adjacent windings, wherein one or more windings of the second winding section comprise windings having a smaller diameter than other windings of the second winding section for making contact with a male pin when the male pin is inserted along the axis of the sleeve spring contact, and further wherein each of the conductive sleeve spring contacts comprises a conductive pin element mounted at least partially within the opening proximate the second surface region, wherein the conductive pin element comprises an engagement surface to engage a second end of the plurality of windings mounted within the opening, and further wherein the conductive pin element is mounted at least partially within the opening proximate the second surface region using a curable material such that the plurality of windings are at least partially compressed within the opening between the engagement surface proximate the first surface region and the engagement surface of the conductive pin element.

2. The adapter apparatus of claim 1, wherein the first winding section of the sleeve spring contact comprises one or more windings that are not in contact with adjacent windings to allow compression of the sleeve spring contact when being mounted in a corresponding opening of the plurality of openings.

3. The adapter apparatus of claim 1, wherein the plurality of windings are mounted within the opening in a compressed state.

4. The adapter apparatus of claim 3, wherein the sleeve spring contact further comprises a conductive pin element to mount the plurality of windings within the opening in a compressed state, wherein the conductive pin element comprises a first end portion comprising an engagement surface for contact with an end of the plurality of windings and a second end portion opposite the first end portion configured for attachment to corresponding pads of a target board.

5. The adapter apparatus of claim 1, wherein the conductive pin element is press-fit at least partially within the opening proximate the second surface region such that the plurality of windings are at least partially compressed within the opening between the engagement surface proximate the first surface region and the engagement surface of the conductive pin element.

6. The adapter apparatus of claim 1, wherein the spring sleeve contact is mounted within the opening such that the first winding section is configured to allow a male pin to be inserted therethrough and such that the windings of the second winding section having a smaller diameter contact the male pin inserted therein, and further wherein the second winding section is in contact with the conductive pin element.

7. The adapter apparatus of claim 1, wherein the engagement surface of the conductive pin element is part of a first end portion of the conductive pin element that further comprises an elongate element configured to extend within the center of the second winding section, and further wherein the conductive pin element comprises a second end portion opposite the first end portion configured for attachment to corresponding pads of a target board.

8. An adapter apparatus comprising a plurality of conductive sleeve spring contacts, wherein each sleeve spring contact comprises a conductive sleeve spring extending between a first spring end and a second spring end along a spring axis, wherein each sleeve spring comprises a first winding section comprising a plurality of windings about the spring axis terminating in the first spring end and a second winding section comprising a plurality of windings terminating in the second spring end, wherein the plurality of windings of the second winding section of the sleeve spring comprise at least three or more windings in contact with adjacent windings and at least one or more windings that have a smaller diameter than other windings of the second winding section for making contact with a male pin when the male pin is inserted along the axis of the sleeve spring, and further wherein the first winding section of the sleeve spring comprises a plurality of windings that are not in contact with adjacent windings, wherein each of the plurality of conductive sleeve spring contacts are mounted in a corresponding opening of a plurality of openings defined in a substrate, wherein the substrate comprises a first surface region and a second surface region opposite the first surface region, wherein each of the openings is defined through the substrate from the first surface region to the second surface region, wherein an engagement surface defines at least a portion of the opening proximate the first surface region to engage a first spring end of a sleeve spring mounted within the opening, and further wherein the adapter apparatus comprises a conductive pin element mounted at least partially within the opening proximate the second surface region, wherein the conductive pin element comprises an engagement surface to engage the second spring end of the sleeve spring mounted within the opening, and further wherein the conductive pin element is mounted at least partially within the opening proximate the second surface region using a curable material such that the sleeve spring is at least partially compressed within the opening between the engagement surface proximate the first surface region and the engagement surface of the conductive pin element.

9. The adapter apparatus of claim 8, wherein each of the conductive sleeve springs is mounted within the opening in a compressed state by a conductive pin element, wherein the conductive pin element comprises a first end portion for contact with the second spring end terminating the second winding section and a second end portion opposite the first end portion configured for attachment to a corresponding pad of a target board.

10. The adapter apparatus of claim 8, wherein the conductive pin element is press-fit at least partially within the opening proximate the second surface region such that the sleeve spring is at least partially compressed within the opening between the engagement surface proximate the first surface region and the engagement surface of the conductive pin element.

11. A method for use in forming an adapter apparatus, wherein the method comprises:
providing a substrate including a plurality of openings defined therethrough, wherein the substrate comprises a first surface region and a second surface region opposite the first surface region, wherein each of the openings is defined through the substrate from the first surface region to the second surface region, and further wherein an engagement surface defines at least a portion of the opening proximate the first surface region;
inserting a conductive sleeve spring into each of the plurality of openings at the second surface region, wherein each conductive sleeve spring extends between a first spring end and a second spring end along a spring axis, wherein each sleeve spring comprises a first winding section comprising a plurality of windings about the spring axis terminating in the first spring end and a second winding section comprising a plurality of windings terminating in the second spring end, wherein the plurality of windings of the second winding section of the sleeve spring comprises at least three or more windings in contact with adjacent windings and at least one or more windings that have a smaller diameter than other windings of the second winding section for making contact with a male pin when the male pin is inserted along the axis of the sleeve spring, and further wherein the first winding section of the sleeve spring comprises a plurality of windings that are not in contact with adjacent windings; and
positioning a conductive pin element at least partially within the opening proximate the second surface region to compress the sleeve spring within the opening, wherein the conductive pin element comprises an engagement surface, and further wherein positioning the conductive pin element at least partially within the opening proximate the second surface region to compress the sleeve spring within the opening comprises mounting the conductive pin element at least partially within the opening using a curable material and compressing the sleeve spring between the engagement surface proximate the first surface region and the engagement surface of the conductive pin element.

12. The method of claim 11, wherein positioning the conductive pin element at least partially within the opening proximate the second surface region to compress the sleeve spring within the opening comprises press-fitting the conductive pin element at least partially within the opening.

* * * * *